United States Patent [19]

Sakai et al.

[11] Patent Number: 4,589,001
[45] Date of Patent: May 13, 1986

[54] QUASIPARTICLE INJECTION CONTROL TYPE SUPERCONDUCTING DEVICE

[75] Inventors: Shigeki Sakai, Sakuramura; Hiroshi Tateno, Yatabemachi; Shoei Kataoka, Tanashi, all of Japan

[73] Assignees: Agency of Industrial Science & Technology; Ministry of International Trade & Industry, both of Tokyo, Japan

[21] Appl. No.: 603,984

[22] Filed: Apr. 26, 1984

Related U.S. Application Data

[63] Continuation of Ser. No. 281,037, Jul. 7, 1981, abandoned.

[30] Foreign Application Priority Data

Jul. 9, 1980 [JP] Japan ................................. 55-93522
Oct. 30, 1980 [JP] Japan ............................... 55-152904

[51] Int. Cl.[4] .......................................... H01L 39/22
[52] U.S. Cl. ....................................................... 357/5
[58] Field of Search ......................................... 357/5, 6

[56] References Cited

U.S. PATENT DOCUMENTS 4,157,555  6/1979  Gray ....................................... 357/5
4,334,158  6/1982  Faris ................................... 357/5 X

OTHER PUBLICATIONS

Kircher et al., "Josephson Tunnel-Junction Electrode Materials", *Science,* vol. 208, May 23, 1980, pp. 944–950.
Kittel, C., "Introduction to Solid State Physics", (4th ed.), John Wiley & Sons, Inc., (1971) p. 412.
Laugenberg et al., "The Making of Josephson Junctions", *Electronics,* 44, No. 5, Mar. 1, 1971, pp. 42–44.

*Primary Examiner*—Martin H. Edlow
*Attorney, Agent, or Firm*—Oblon, Fisher, Spivak, McClelland & Maier

[57] ABSTRACT

A quasiparticle control device including a Josephson junction element formed of a pair of superconductors joined to each other, with a weak link part intervening therebetween, and a third electrode provide on the weak link part. The characteristics of the Josephson junction of the Josephson junction element is controlled by injecting quasiparticles to the third electrode.

12 Claims, 34 Drawing Figures

QUASIPARTICLE INJECTION CONTROL TYPE SUPERCONDUCTING DEVICE

This application is a continuation of application Ser. No. 281,037, filed Jul. 7, 1981, now abandoned.

BACKGROUND OF THE INVENTION

This invention relates to a superconducting device which comprises a Josephson junction element and at least one third electrode for injection of quasiparticles attached to the Josephson junction element and serves for the purpose of controlling the current-voltage characteristic of the Josephson junction, the superconducting critical current, and the Josephson junction voltage.

The tremendous advance achieved in electronic technology in recent years has made various industrial branches specializing in data processing, space telecommunication, instrumentation, etc. feel a strong need for early realization of ultrahigh-speed switching of signals, high-sensitivity low-noise detection and amplification of high-frequency signals, and the like.

The growth of electronic technology has to date been promoted by the development of devices comprised mainly of semiconductors, particularly transistors. With a view to permitting further increase of the speed of signal transmission and satisfying the demand for energy saving, extensive research is now under way toward the development of devices which are formed mainly of superconductors and adapted to operate under extremely low (cryogenic) temperatures.

In the conventional cryogenic devices of this nature, the commonest method adopted for controlling the characteristics of the Josephson junction element comprises disposing control lines close to the element and effecting the required control using the magnetic fields generated by the control lines. By this method, however, the number of layers required for the lines inevitably increases, raising the chance of the devices suffering from line breakage, short-circuiting and other failures and from degradation of reliability of performance. Thus, it has not been easy for the devices to be integrated as desired.

SUMMARY OF THE INVENTION

A main object of this invention is to provide a superconducting device wherein the current-voltage characteristic of Josephson junction, the superconducting critical current, and the Josephson junction voltage can be easily controlled.

Another object of this invention is to provide a superconducting device which enjoys high reliability of performance and permits ready formation of integrated circuits.

To accomplish the objects described above according to the present invention, there is provided a superconducting device which is obtained by converting a Josephson junction element into a device by having at least one third electrode for injection of quasiparticles joined through the medium of an insulating barrier to at least one of the pair of superconductors and the weak link part composing the Josephson junction element, so that the control of the characteristics of the Josephson junction is effected by the injection of quasiparticles into the Josephson junction element through the third electrode so incorporated.

Since this invention accomplishes the required control of the junction characteristics of the Josephson junction element by means of the third electrode incorporated as described above, it notably alleviates the limits heretofore imposed on the size of the device, renders easier the formation of integrated circuits, and improves the performance reliability of the device.

The other objects and characteristics of the present invention will become apparent from the further description of the invention to be given hereinafter with reference to the accompanying drawing.

DESCRIPTION OF PREFERRED EMBODIMENTS

Figure 1A:
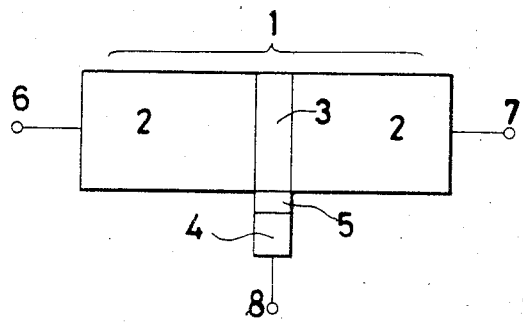
FIG. 1(A) is a schematic diagram of the first basic construction of the quasiparticle injection control type superconducting device according to this invention.

FIG. 1(A) represents the first embodiment of the basic construction of the quasiparticle injection control type superconducting device according to the present invention. It is constructed by attaching a third electrode 4 through the medium of an insulating barrier 5 to a weak link part 3 of a known Josephson junction element 1 which comprises two superconductors 2 and a part 3 for linking the superconductors weakly from the standpoint of quantum mechanics. The characteristics of the Josephson junction are controlled by the injection of quasiparticles through the third electrode 4 into the weak link part 3.

The third electrode 4 is formed of a normal metal, a superconducting metal, or a semiconductor and the insulating barrier 5 is formed of an insulating film. Where the third electrode is made of a semiconductor, the Schottky barrier of the junction between the weak link part and the semiconductor brings about the effect of an insulating film, making it possible to omit the insulating barrier 5 from the device. To the superconductors 2 and the third electrode 4, Josephson junction terminals 6, 7 and a control terminal 8 are respectively connected.

When the third electrode is connected to the weak link part of the Josephson junction element, the device as a whole exhibits high sensitivity.

Figure 1B:
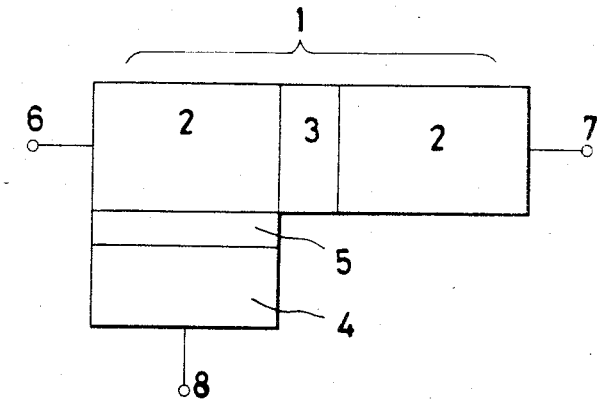
FIG. 1(B) is a schematic diagram of the second basic construction of the superconducting device according to this invention.

FIG. 1(B) represents the second embodiment of the basic construction of the superconducting device according to the present invention. It is constructed by attaching a third electrode 4 for injection of quasiparticles made of a normal metal, a superconducting metal, or a semiconductor through the medium of an insulating barrier 5 to either of the two superconductors 2 of the known Josephson junction element 1 mentioned above. Where the third electrode 4 is made of a semiconductor, the insulating film may be omitted for the same reason as in the first embodiment. The characteristics of the Josephson junction are controlled by injecting quasiparticles through the third electrode 4 into the superconductor to which the electrode is attached.

This embodiment makes the device easy to manufacture and is applicable to any type of Josephson junction element. The closer to the weak link part the third electrode is positioned, the higher the sensitivity of the device.

Figure 1C:
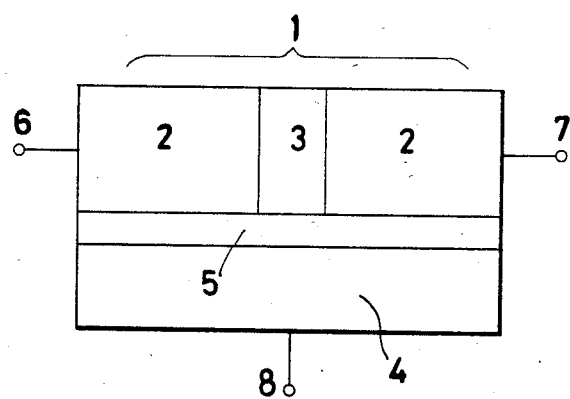
FIG. 1(C) is a schematic diagram of the third basic construction of the superconducting device according to this invention.

FIG. 1(C) represents the third embodiment of the basic construction of the superconducting device according to the present invention. It is constructed by attaching a third electrode 4 for injection of quasiparticles made of a normal metal, a superconducting metal, or a semiconductor through the medium of an insulating barrier 5 to both the two superconductors 2 and the weak link part 3 of the known Josephson junction element 1 mentioned above. Where the third electrode 4 is made of a semiconductor, the insulating film may be omitted for the same reason as in the first embodiment. The characteristics of the Josephson junction are controlled by injecting quasiparticles through the electrode 4 to the two superconductors 2 and the weak link part 3.

The device according to this embodiment is easy to manufacture and excellent in sensitivity.

Figure 1D:
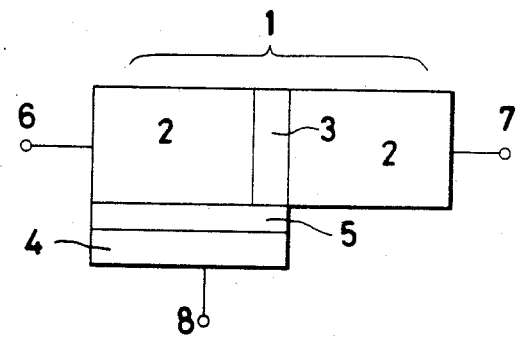
FIG. 1(D) is a schematic diagram of the fourth basic construction of the superconducting device according to this invention.

FIG. 1(D) represents the fourth embodiment of the basic construction of the superconducting device according to the present invention. It is constructed by attaching a third electrode 4 for injection of quasiparticles made of a normal metal, a superconducting metal, or a semiconductor through the medium of an insulating barrier 5 to one of the two superconductors 2 and the weak link part 3 of the same known Josephson junction element 1 as described in the foregoing embodiment. Where the third electrode 4 is made of a semiconductor, the insulating film may be omitted for the same reason as in the first embodiment. The characteristics of the Josephson junction are controlled by injecting quasiparticles through the third electrode into one of the superconductors and the weak link part.

The device according to this embodiment is easy to manufacture and excellent in sensitivity as in the immediately preceeding embodiment.

Figure 1E:
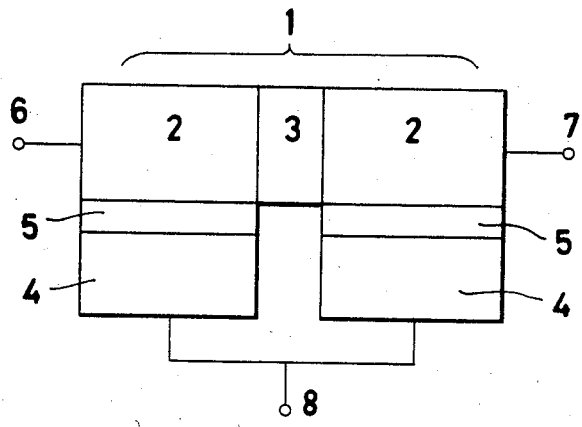
FIG. 1(E) is a schematic diagram of the fifth basic construction of the superconducting device according to this invention.

FIG. 1(E) represents the fifth embodiment of the basic construction of the superconducting device according to the present invention. It is constructed by attaching a third electrode 4 for injection of quasiparticles made of a normal metal, a superconducting metal, or a semiconductor through the medium of an insulating barrier 5 to each of the pair of superconductors 2 of the same known Josephson junction element 1 as described in the foregoing embodiment. Where the third electrode 4 is made of a semiconductor, the insulating film may be omitted for the same reason as in the first embodiment. It effects the control of the characteristics of the Josephson junction by injecting quasiparticles through the third electrode to the two superconductors.

This embodiment is applicable particularly to a Josephson junction element having the weak link part made of an insulator.

Figure 2:
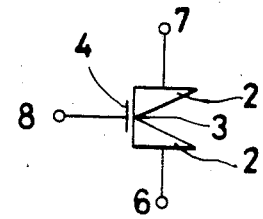
FIG. 2 is an equivalent circuit diagram of the superconducting device according to this invention.

The equivalent circuits of the five embodiments described above will be collectively indicated by the symbols shown in FIG. 2.

In the aforementioned embodiments, any superconductor which can constitute the Josephson junction element may be used. When Nb, Sn or Pb is used, for example, the device is easy to manufacture. In the case of NbN, Nb$_3$Ge or Nb$_3$Sn, the device can be used at a relatively high temperature, i.e. at a temperature of 10 K or more, because it exhibits a high superconducting transition temperature. When a Pb-Au-In alloy is used, the device has high reliability.

Any normal metal, any superconducting metal or any semiconductor may be used as the third electrode 4. When a normal metal such as Al, Au or Ag is used, for example, the device is easy to manufacture. Use of the superconducting metals Nb, Sn or Pb has an advantage in that the device can easily be manufactured, whereas use of the superconducting metals NbN, Nb$_3$Ge or Nb$_3$Sn brings about a merit that the device can be used at a relatively high temperature (more than 10 K), and use of the superconducting metal Pb-Au-In alloy has a merit that the device has high reliability. Further, use of the semiconductors Si, Ge, GaAs, InP, InAs or InSb makes the device easy to manufacture. The semiconductor is desired to have resistivity in the range of from $5 \times 10^{-3}$ Ω·cm to $1 \times 10^{-4}$ Ω·cm at room temperature because it does not lose its conductivity at the cryogenic temperature at which the device functions. When a semiconductor is used as the third electrode, as described above, the Schottky barrier of the junction serves as an insulating film and, therefore, the insulating barrier 5 may be omitted. The insulating barrier 5 may be formed of an insulator such as aluminum oxide, niobium oxide, tin oxide, lead oxide, etc. or of a semiconductor different from the semiconductor of which the third electrode 4 is made. The semiconductor used as the insulating barrier has resistivity of more than $1\times10^{-4}$ Ω·cm at room temperature and amorphous Si or amorphous Ge is advantageously used in manufacturing the semiconductor.

Where normal metals or superconducting metals are used as the third electrode, integration of the devices is easy because such metals can easily be attached to the Josephson junction element. Since the superconductors have no resistance, the input resistance of the device is precisely determined in accordance with the tunnel resistance of the insulating barrier 9.

Where semiconductors are used as the third electrode, the Schottky barrier in the junction serves as the insulating barrier and, therefore, no insulating material is required and the process for manufacturing the device is simplified. Further, since a semiconductor wafer substrate is advantageously utilized as part of the Josephson junction element, integration of the devices is easy.

Now, the manners in which the third electrode for injection of quasiparticles is attached to the Josephson junction element in its various possible constructions to realize the quasiparticle injection control type superconducting devices contemplated by this invention will be described. Particularly, typical embodiments of the invention will be described with reference to the schematic structural diagrams of FIGS. 3-5.

FIG. 3 represents a various modification of the first embodiment of the basic construction in which the third electrode 4 for the injection of quasiparticles is attached to the weak link part of the superconductors. FIG. 3(A) represents a modification in which the weak link part 3 of the Josephson junction element 1 is made in a sandwiched pattern of a normal metal, a semiconductor, a normal semimetal or a superconducting metal having a lower superconducting critical temperature than the two superconductors 2 disposed one on either side of the link part 3. In this modification, the weak link part is 0.03-3.0 μm in length "l" and examples of the normal metals used as the weak link part include Al, Au and Ag, those of the semiconductors used for the same purpose include Si and Ge and those of the normal semimetals for the same purpose include Te.

Figure 3A:
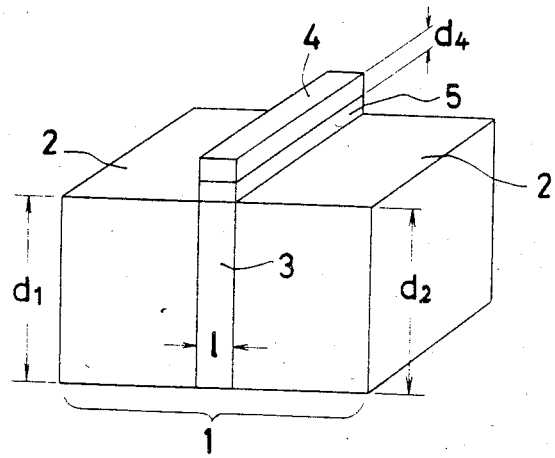
FIGS. 3(A), 3(B), 3(C), 3(D) and 3(E) are schematic structural diagrams of embodiments which are modifications of the superconducting device of FIG. 1(A).
Figure 3B:
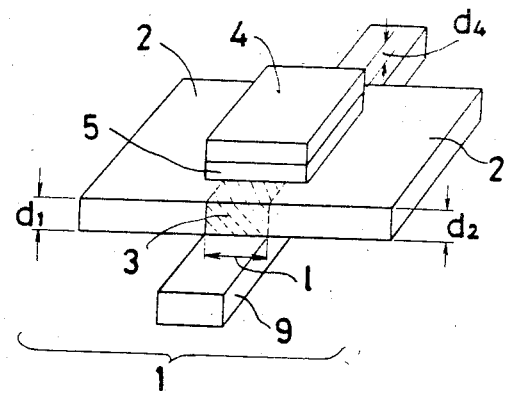

FIG. 3(B) represents a modification of the device in which the weak link part 3 of the Josephson junction element is formed by utilizing the proximity effect of direct contact thereof with a normal metal piece 9. The length "l" of the weak link in this modification is 0.03-3.0 μm and is determined in accordance with the width of the normal metal piece 9. Examples of the normal metals used as the piece 9 include Al, Au and Ag.

Figure 3C:
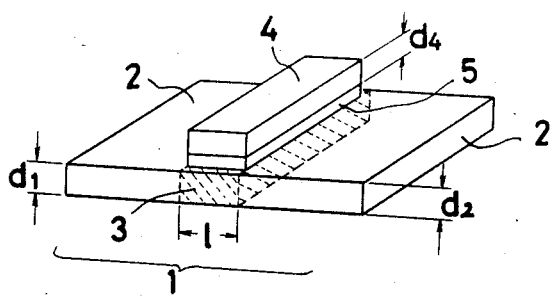

FIG. 3(C) represents a modification of the device in which the weak link part 3 of the Josephson junction element 1 is formed by driving impurity atoms by the ion-implantation technique into a middle portion of the layer of a superconducting metal thereby dividing the resultant layer into two superconductors interposed by the resultant weak link portion. In this modification, the length "l" of the weak link part is 0.03-3.0 μm and the resistivity of the Josephson junction element under application of voltage can suitably be selected by the ion quantity of the impurity atoms implanted. For example, Ar$^+$ is advantageously used as ion of the impurity atom implanted.

Figure 3D:
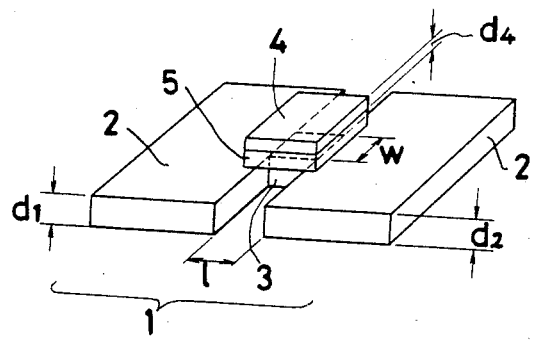

FIG. 3(D) represents a modification of the device in which the Josephson junction element 1 is formed by connecting the two superconductors laterally through the medium of a microbridge type junction (with the weak link part 3 serving as the bridge portion). The weak link part in this modification is 0.02-2.0 μm both in length "l" and in width "w".

Figure 3E:
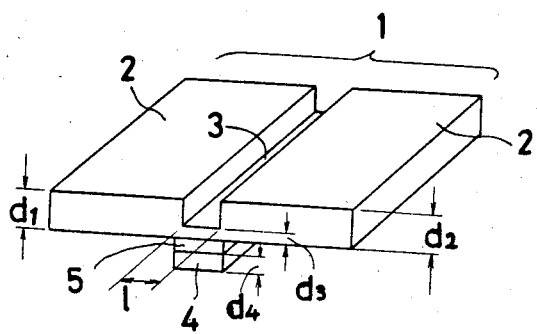

And FIG. 3(E) represents a modification of the device in which the weak link part 3 of the Josephson junction element 1 is formed by giving to the weak link part 3 a layer thickness smaller than the thickness of the superconductors 2. In this modification, the weak link part has a length "l" of 0.02-2.0 μm and a thickness "d$_3$" one third to one twentieth of the thickness of the superconductors.

In the modifications shown in FIG. 3(A) through FIG. 3(E), the superconductors 2 have thicknesses "d$_1$" and "d$_2$" respectively of 0.02-2 μm; the third electrode 4, when it is made of a normal metal or superconducting metal, has a thickness "d$_4$" of 0.02-2 μm and, when it is made of a semiconductor, has a thickness "d$_4$" of 2-400 μm because a semiconductor wafer may be adopted; and the insulating barrier, when it is made of an insulator, has a thickness of 20-100 Å and, when it is made of a semiconductor different from that used as the third electrode 4, has a thickness of 100-1000 Å.

FIG. 4 represents various modifications of the second embodiment of the basic construction in which the third electrode 4 for the injection of quasiparticles is attached to only one of the pair of superconductors. FIG. 4(A) represents a modification of the device in which the Josephson junction element 1 uses a weak link part 3 made of an insulating film and is sandwiched between the two superconductors 2. The weak link part in this modification has a length "l" of 20-100 Å.

Figure 4A:
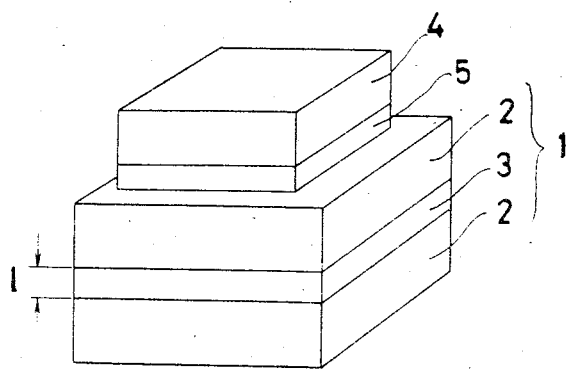
FIGS. 4(A), 4(B), 4(C) and 4(D) are schematic structural diagrams of embodiments which are modifications of the superconducting device of FIG. 1(B).
Figure 4B:
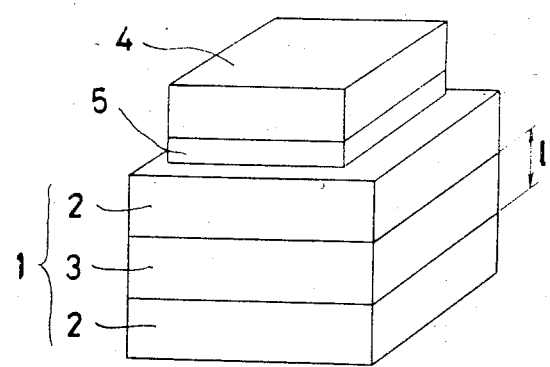

FIG. 4(B) represents a modification of the device in which the weak link part 3 of the Josephson junction element 1 is made of a normal metal, a semiconductor or a superconducting metal having a lower superconducting critical temperature than the two externally adjoining superconductors 2 and is sandwiched between the two superconductors. In this modification, the length "l" of the weak link part is 0.03-3.0 μm and the same elements as those used in the modification shown in FIG. 3(A) may be adopted as the weak link part.

Figure 4C:
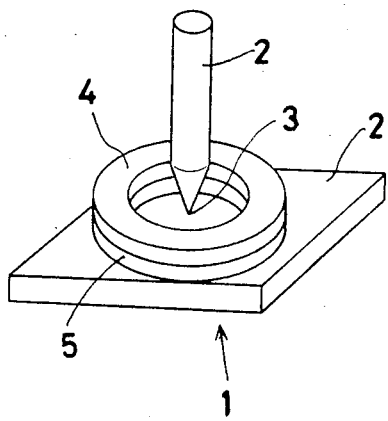

FIG. 4(C) represents a modification of the device in which the Josephson junction element 1 is formed by a point contact type junction, which point contact junction serves as the weak link part 3. The rod-shaped superconductor in this modification has a diameter in the range of 50-100 μm and has an area in contact with the weak link part falling in the range of $10^{-11}$-$10^{-8}$ cm$^2$.

Figure 4D:
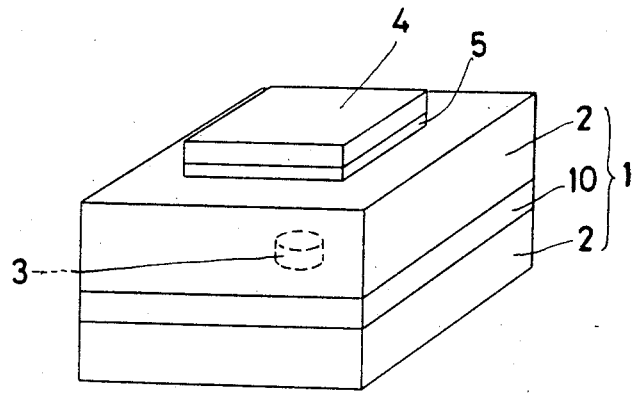

FIG. 4(D) represents a modification of the device in which the Josephson junction element 1 is formed by connecting the two superconductors longitudinally through the medium of a microbridge type junction. In this modification, the insulator 10 has a thickness of 0.02-2.0 μm and a bore formed in the insulator has a diameter of 0.02-2.0 μm and serves as the weak link part, and the length of the weak link part can be made relatively small because it is determined in accordance with the thickness of the insulator 10.

The thickness of the superconductors, that of the third electrode and that of the insulating barrier shown in the embodiments of FIG. 4 are the same as those shown in the embodiments of FIG. 3.

FIG. 5 represents various modifications of the third embodiment of the basic construction in which the third electrode 4 for the injection of quasiparticles is attached to both the pair of superconductors 2 and weak link part 3. FIG. 5(A) represents a modification of the device in which the weak link part 3 of the Josephson junction element 1 is formed to make use of the proximity effect due to the direct contact of the link part 3 with a normal metal piece 9. The length "l" of the weak link part in this modification is 0.03-3.0 μm and is determined in accordance with the width of the normal metal piece 9. Examples of the normal metals used as the piece 9 include Al, Au and Ag.

Figure 5A:
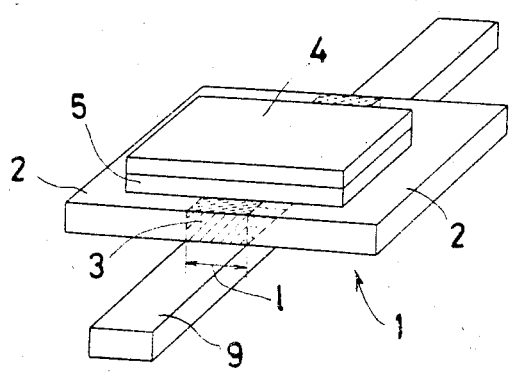
FIGS. 5(A), 5(B), 5(C), 5(D) and 5(E) are schematic structural diagrams of embodiments which are modifications of the superconducting device of FIG. 1(C).
Figure 5B:
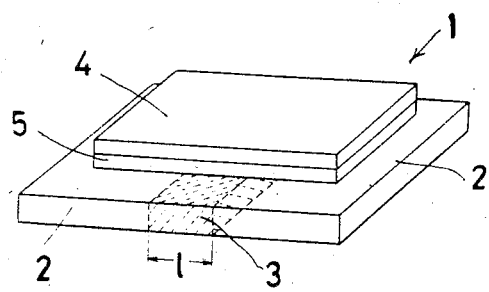

FIG. 5(B) represents a modification of the device in which the weak link part 3 of the Josephson junction element 1 is formed by driving impurity atoms by the ion-implantation technique into a middle portion of the layer of a superconducting metal thereby dividing the layer into two superconductors interposed by the resultant weak link portion. In this modification, the length "l" of the weak link part is 0.03-3.0 μm and the resistivity of the Josephson junction element under application of voltage can suitably be selected by the ion quantity of the impurity atoms implanted. For example, $Ar^+$ is advantageously used as ion of the impurity atom implanted.

Figure 5C:
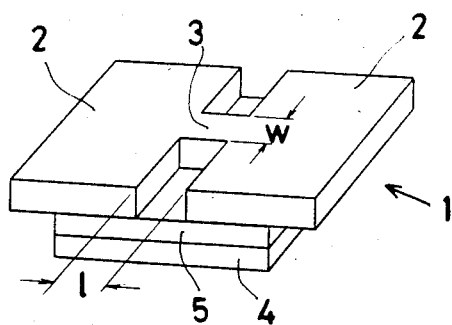

FIG. 5(C) represents a modification of the device in which the Josephson junction element 1 is formed by connecting the two superconductors laterally through the medium of a microbridge type junction (with the weak link part 3 serving as the bridge portion). The weak link part in this modification is 0.02-2.0 μm both in length "l" and in width "w".

Figure 5D:
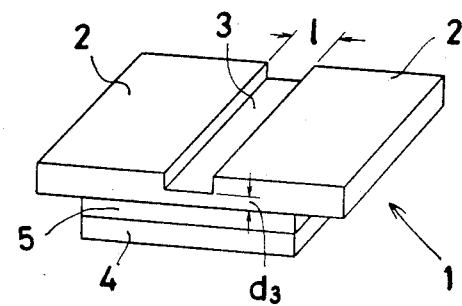

FIG. 5(D) represents a modification of the device in which the weak link part 3 of the Josephson junction element 1 is formed by giving to the weak link part 3 a layer thickness smaller than the thickness of the superconductors 2 of the junction element. In this modification, the weak link part has a length "l" of 0.02-2.0 μm and a thickness "$d_3$" one third to one twentieth of the thickness of the superconductors.

Figure 5E:
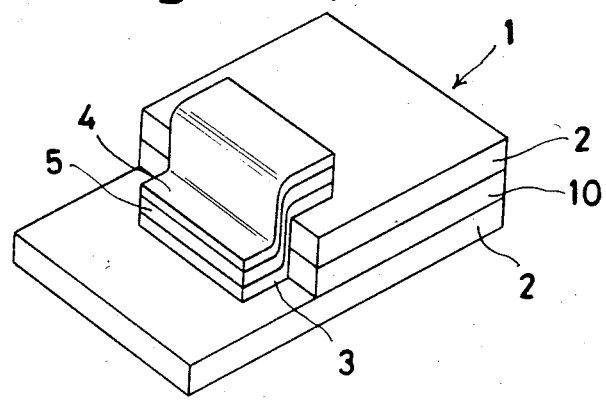

And FIG. 5(E) represents a modification of the device in which the Josephson junction element 1 is formed by allowing the two superconducting layer electrodes sandwiching one insulating layer 10 to be vertically joined to each other through the medium of a semiconductor, a normal metal, a normal semimetal or a superconducting metal having a lower superconducting critical temperature than the superconductors. In this modification, the thickness of the insulator 10 is 0.02-2.0 μm and the length of the weak link part 3 is substantially the same as the thickness of the insulator.

The thickness of the superconductors, that of the third electrode and that of the insulating barrier shown in the modifications of FIG. 5(A) through FIG. 5(E) are the same as those shown in the modifications of FIG. 3.

Besides the modifications illustrated above with reference to the diagrams, other modifications of the second embodiment of the basic construction of the present invention may be materialized by attaching the third electrode 4 for the injection of quasiparticles through the medium of an insulating barrier to one of the pair of superconductors in the various known Josephson junction elements illustrated in FIGS. 3(B) through 3(E) and FIG. 5(E). And other modifications of the third embodiment of the basic construction of the present invention may be obtained by attaching the third electrode 4 for the injection of quasiparticles to the two superconductors and the interposed weak link part in the various known Josephson junction elements 1 illustrated in FIG. 3(A) and FIG. 4(B).

Modifications of the fourth embodiment of the basic construction of FIG. 1(D) are materialized by attaching the third electrode for the injection of quasiparticles through medium of an insulating barrier to one of the two superconductors and the weak link part in the various known Josephson junction elements 1 illustrated in FIGS. 3, 4, and 5.

Similarly, modifications of the fifth embodiment of the basic construction of FIG. 1(E) are materialized by attaching the third electrode for the injection of quasiparticles through the medium of an insulating barrier to both of the two superconductors and the weak link part in the various known Josephson junction elements 1 illustrated in FIGS. 3, 4, and 5.

Now, the operation, principle, and function of the superconducting device of the present invention as applied to a switching circuit will be described with reference to the diagram and the graphs of FIGS. 6-8.

Figure 6:
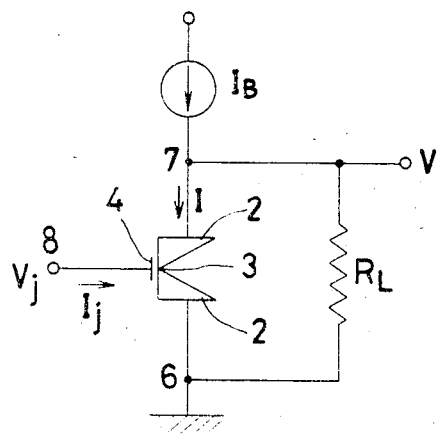
FIG. 6 is a circuit diagram illustrating one application of the device of this invention to a switching circuit.
Figure 7:
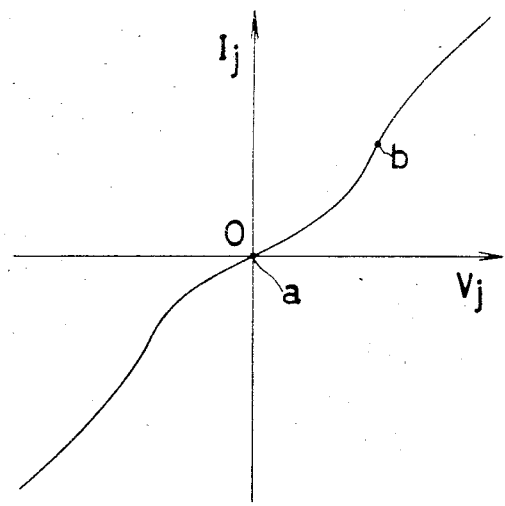
FIG. 7 is a graph showing the relation between the voltage and the current applied to the injection electrode in the device of this invention applied to the circuit of FIG. 6.

With respect to the device taken independently, when a voltage of $V_j$ is applied to the electrode terminal 8, the relation between the current $I_j$ flowing in through the terminal 8 and the applied voltage $V_j$ is as indicated by the graph of FIG. 7. Although the present device operates irrespectively of the polarity of the applied voltage $V_j$, the operation of the circuit of FIG. 6 will be described on the assumption that the applied voltage is in positive state for the simplicity of explanation.

Figure 8:
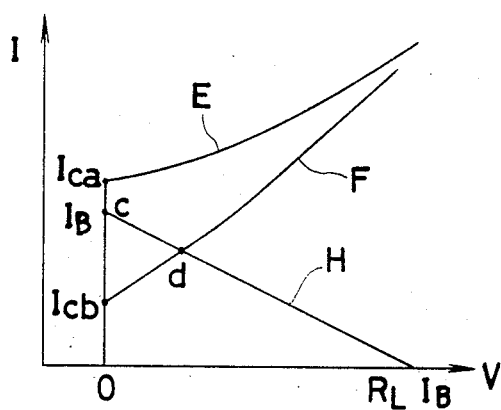
FIGS. 8(A) and 8(B) are diagrams showing the relation between the voltage and the current as observed at the Josephson junction in the device of this invention applied to the circuit of FIG. 6.
Figure 8:
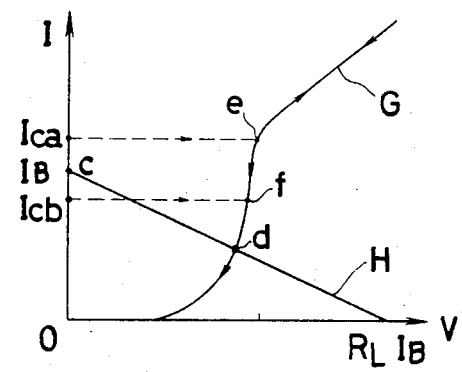

When the applied voltage $V_j$ is 0 (the state indicated by "a" in FIG. 7), the relation between the voltage and the current in the Josephson junction is shown by curves in FIG. 8. Here, FIG. 8(A) represents the characteristics which do not reflect the effect of hysteresis in the relation between the voltage and the current in the Josephson junction. These characteristics are typically observed as when the Josephson junction is in the microbridge form as illustrated in FIG. 3(C). FIG. 8(B) represents the characteristics which reflect the effect of hysteresis in the relation between the voltage and the current in the Josephson junction. These characteristics are typically observed as when the Josephson junction is in the form sandwiching an insulating layer as shown in FIG. 4(A). In FIG. 8(A), when the current value is increased from zero (the original point) in the positive direction, the device is kept in a superconductive state until the current value reaches the value Ica and, therefore, no voltage occurs between the terminals 6 and 7. When the current value exceeds Ica, voltage occurs and by further increasing the current value, the current-voltage relation is represented by the curve "E" in FIG. 8(A) between the terminals 6 and 7. By decreasing the increased current, the relation between the current and the voltage pursues the curve "E" and reaches the original point. In FIG. 8(B), when the current value is increased from zero in the positive direction, the device is kept in a superconductive state until the current value reaches the value Ica and, therefore, no voltage occurs between the terminals 6 and 7. As soon as the current value exceeds the Ica, voltage (point "e") occurs suddenly and, when the current is further increased, the voltage is increased as shown by the curve "G" in FIG. 8(B). By decreasing the increased current, the relation between the current and the voltage pursues the curve "G", passes the points "e", "f" and "d" successively and reaches the original point.

With reference to FIG. 6, as the applied voltage $V_j$ gradually gains in magnitude, the quasiparticles are injected into the weak link part in the first embodiment of the basic construction, into one of the two superconductors in the second embodiment of the basic construction, into both of the two superconductors and the weak link part in the third embodiment of the basic construction, into one of the two superconductors and the weak link part in the fourth embodiment of the basic construction, and into the two superconductors in the fifth embodiment of the basic construction, with the result that the degree of linkage of the Josephson junction is weakened. When the applied voltage $V_j$ is in the state of "b" in FIG. 7, the voltage-current characteristic between the Josephson junction terminals 6, 7 of FIG. 6 is shown by curves in FIG. 8. To be specific, when the current value is increased from zero (the original point) in the positive direction in FIG. 8(A), the device is kept in a superconductive state until the current reaches the value Icb and, by further increasing the current value, the current and the voltage are increased to have their relation shown by the curve "F". By decreasing the increased current, the current-voltage relation pursues the curve "F" and reaches the original point. When the current value is increased from the original point in the positive direction in FIG. 8(B), the device is kept in a superconductive state until the current reaches Icb and, by further increasing the current value, the current-voltage relation is shown by the curve "G". By decreasing the increased current, the current-voltage relation pursues the curve "G", passes the points "e", "f" and "d" and reaches the original point. Since the relation Icb<Ica holds, the voltage in the Josephson junction of FIG. 6 becomes 0 (the point "c" in FIG. 8) when the bias current $I_B$ in the circuit of FIG. 6 is selected in the range between Ica and Icb and the state "a" of FIG. 7 is assumed in the first place. When the applied voltage $V_j$ is varied so as to change this state to the state "b" of FIG. 7, since the bias current $I_B$ becomes greater than the critical current Icb existing at this time, the point of operation is shifted along the load curve "H" to the point "d", with the result that a voltage corresponding to the point "d" of FIG. 8 is produced in the Josephson junction. This means that desired controlling of the Josephson junction voltage and desired switching of the junction can be accomplished by applying a voltage to the electrode 4 for the injection of quasiparticles.

The present invention will be further described with reference to FIGS. 9–11 wherein the superconducting device is applied to an amplifying circuit.

Figure 9:
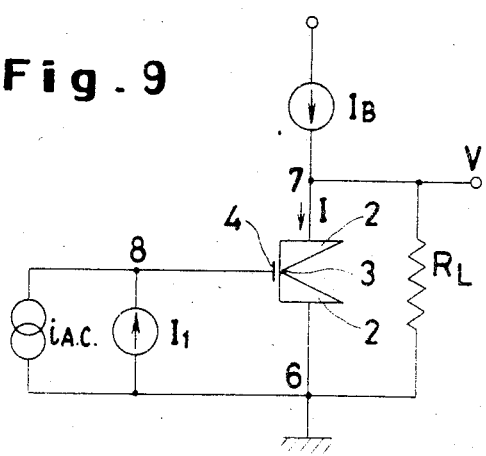
FIG. 9 is a circuit diagram illustrating one application of the device of this invention to an amplifying circuit.
Figure 10:
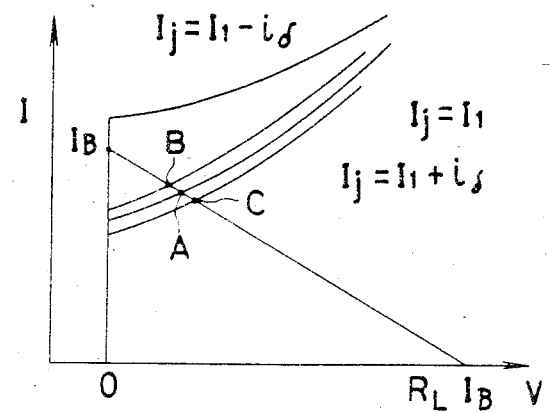
FIG. 10 is a graph showing the static characteristics of the device of this invention for the purpose of explaining the amplifying circuit of FIG. 9.
Figure 11:
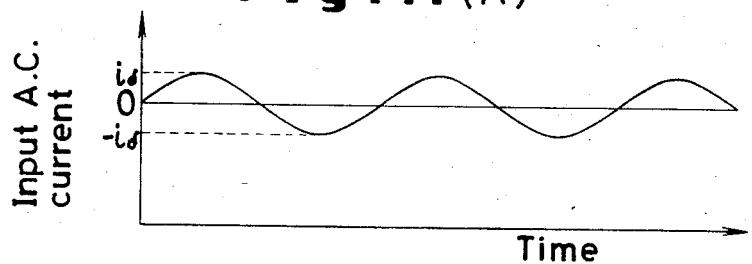
FIGS. 11(A) and 11(B) are time-functional graphs showing input and output alternating currents of the amplifying circuit of FIG. 9.
Figure 11:
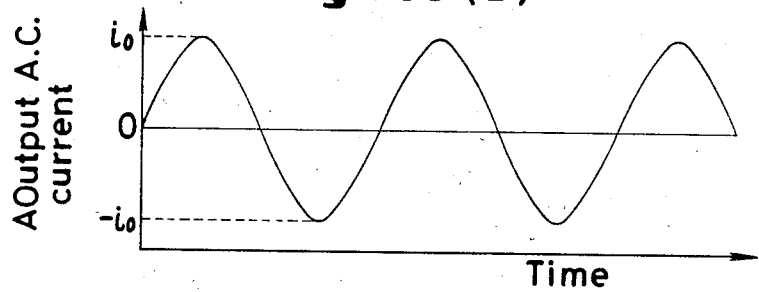

When power sources $I_1$ and $I_B$ and a resistor $R_L$ are connected in parallel to the device as illustrated in FIG. 9, the device is in the state represented by the point "A" of the static characteristic curve shown in FIG. 10. By applying an alternating current (having a peak-to-peak value of $2i_\delta$) as shown in FIG. 11(A) to the third electrode 4 from an AC source $i_{AC}$, at this time, the current flowing through the Josephson junction vibrates between the points "B" and "C" in FIG. 10. Since this current has a higher amplitude than that of the applied current, the AC output flowing through the resistor $R_L$ has an amplitude amplified as shown in FIG. 11(B). The device of this invention, when applied to the amplifying circuit as described above, is characterized in that due to the operation under cryogenic temperatures and the small bias voltage of 1mV at most, only very small noise occurs and for this reason even a very weak electric signal can be amplified.

The device of this invention is manufactured by utilizing the known techniques for manufacturing Josephson junction elements or integrated circuits. To be specific, superconductors are deposited on a substrate by the sputter evaporation method, electron-beam evaporation method or resistance-heating evaporation method. A third electrode made of a normal metal or superconducting metal is attached to the Josephson junction element by the aforementioned evaporation method. Where a semiconductor is used as the third electrode, a semiconductor wafer can be utilized without any modification. The positional determination of the third electrode relative to the Josephson junction element is effected by utilization of an electron-beam lithographic technique or photolithographic technique. An insulating barrier made of an insulator is formed by the plasma oxidation or ion-beam oxidation technique. Where a semiconductor different from the semiconductor of which the third electrode is made, it is formed by the aforementioned evaporation method.

A method for the manufacture of the device of FIG. 3(E), wherein a normal metal is used as the third electrode and an insulator as the insulating barrier, will be described concretely.

On an insulated substrate, aluminum (a normal metal) is deposited to have a thickness of 0.1–1 μm by an evaporation method. SiO as an insulator is deposited on the aluminum layer formed on the substrate by the evaporation method so that it has a thickness of about 0.1 μm. Thereafter, the SiO layer is removed so as to expose the aluminum layer by 0.1–0.5 μm in width over the entire length thereof and an aluminum oxide layer having a thickness of 20–100 Å and serving as the insulating barrier is formed on the exposed aluminum layer.

Subsequently, Nb (a superconducting metal) is deposited on the entire surface comprising the SiO layer and the aluminum oxide layer so as to have a thickness of 0.1–0.2 μm by the evaporation method and a resist is applied onto the Nb layer thus formed. The resist applied onto the part of the Nb layer disposed on the aluminum oxide layer is removed by the electron-beam lithographic or photolithographic technique so as to expose the above-mentioned part of the Nb layer. The exposed part of the Nb layer is caused to have a thickness of 200–300 Å by the dry etching method such as the reactive ion etching method and thereafter the resist applied onto the remaining Nb layer disposed on the SiO layer is removed.

Figure 12:
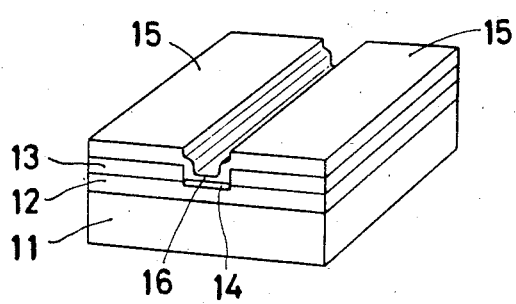
FIG. 12 is a perspective view illustrating the actual construction of one embodiment of the device according to this invention.

The device manufactured by the above-mentioned method is shown in FIG. 12. In this Figure, the Nb layer 15 on the substrate 11 is divided by a groove into two portions which serve as the superconductors. The portion 16 connected to the superconductors functions as the weak link part to which the normal metal 12 is connected through the medium of the very thin, insulating barrier 14 of the aluminum oxide layer. The normal metal is electrically isolated from the superconductors by the insulator 13.

A method for the manufacture of the device of FIG. 5(C), wherein a semiconductor is used as the third electrode and the Schottky barrier constitutes an insulating barrier, will be described hereinafter.

Figure 13:
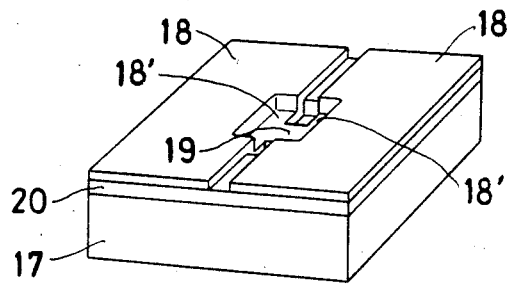
FIG. 13 is a perspective view illustrating the construction of another embodiment of the device according to this invention.

A SiO$_2$ layer of a thickness in the range of 1000–2000 Å is formed on the surface of a Si wafer having resistivity of $\sim 10^{-3}$ Ω·cm at room temperature and a thickness of 100–300 μm by the thermal oxidation or chemical vapor deposition method. The SiO$_2$ layer formed on the central surface of the Si wafer is removed by the photolithographic technique so as to expose the Si wafer by 3×3–5×5 μm$^2$ in surface area. A resist is subsequently applied onto the entire surface comprising the SiO$_2$ layer and the exposed Si wafer. The resist thus applied onto the entire surface is partially removed so that the device to be formed finally may have an H-shaped plan view and, thereafter, Nb (a superconducting metal) is deposited by the evaporation method to have a thickness of 0.05–0.5 μm both on the resist removed surface and on the resist-applied surface. The Nb layer formed on the resist-applied surface is removed together with the resist, thereby accomplishing the device of the present invention. The accomplished device is shown in FIG. 13. In this Figure, the weak link part 19 is 0.02–2.0 μm both in length and in width. A pair of superconductors 18 are disposed on the Si wafer 17 through the medium of the insulator 20 and connected respectively to a pair of superconductors 18' disposed within the angular hole. The superconductors 18' and the weak link part 19 connecting these are kept at their rear surfaces in direct contact with the Si wafer 17. The characteristics of the Josephson junction are controlled by injecting quasiparticles through the Si wafer into the superconductors.

Figure 14B:
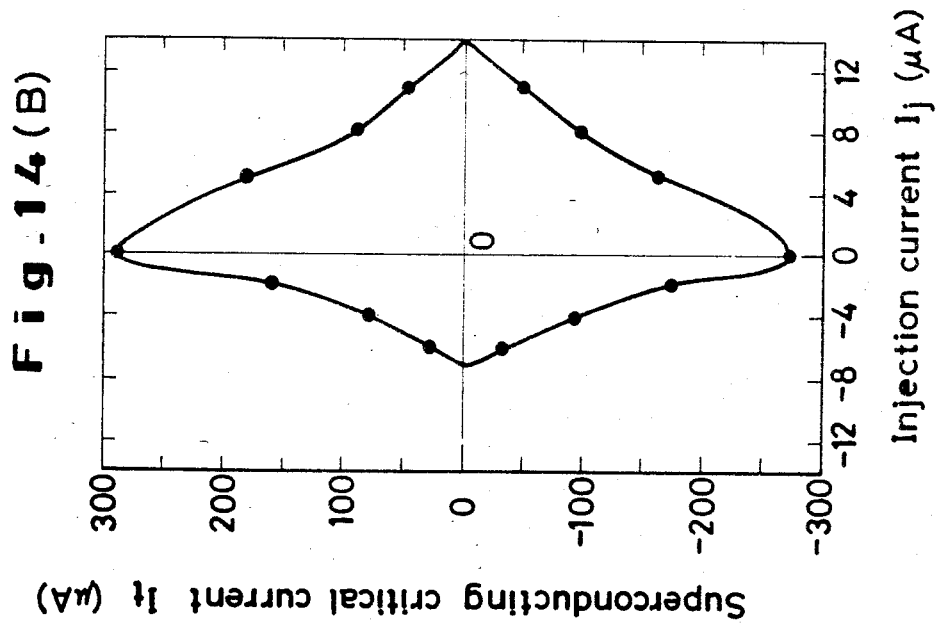
FIG. 14(B) is a graph showing the relation between the quasiparticle injection current and the superconducting critical current in the embodiment shown in FIG. 13.
Figure 14A:
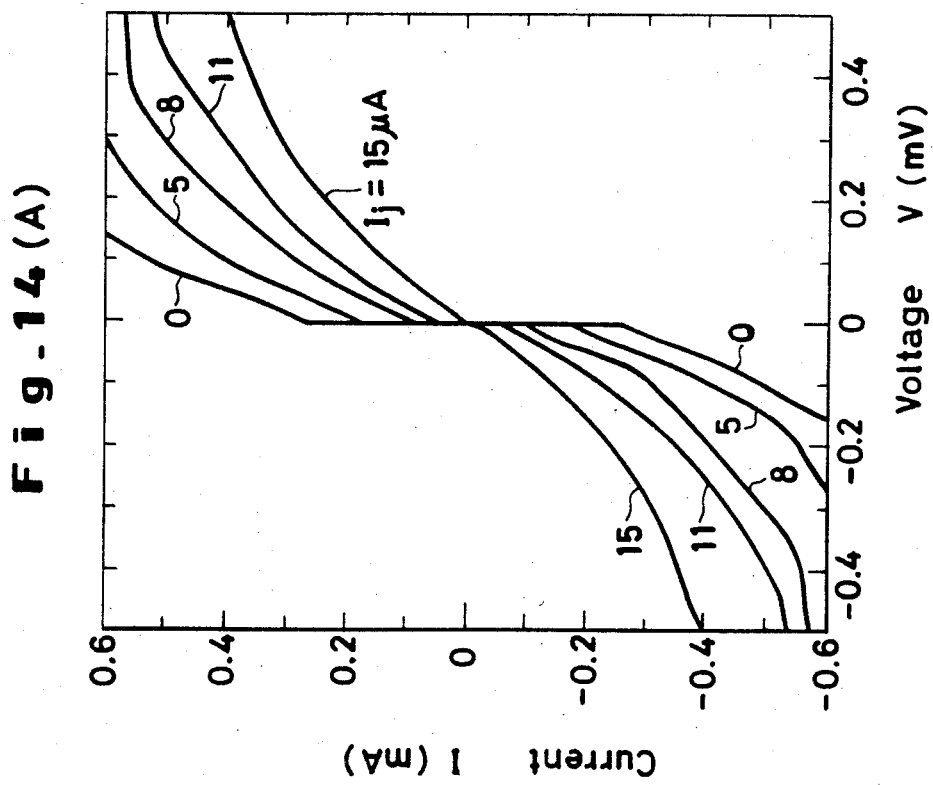
FIG. 14(A) is a graph showing the results of the static characteristics measured in the embodiment shown in FIG. 13.

A device such as shown in FIG. 13 was prepared by using phosphorous-doped Si 160 μm in thickness and 0.001 Ω·cm in resistivity as a Si wafer and setting a SiO$_2$ layer to have a thickness of 1500 Å, a Nb layer to have a thickness of 500 Å, a bridge portion to have a length of 1.0 μm and a width of 1.6 μm, and an angular hole to have an area of 3.75×3.75 μm$^2$. The static characteristics of the prepared device kept at a temperature of 7.5 K were measured. The results are shown in FIG. 14(A). In FIG. 14(A), five curves each showing the voltage-current characteristic in the Josephson junction are drawn, with the current $I_j$ from the third electrode serving as the parameter. The values of the currents $I_j$ are as shown in the Figure. This Figure also shows the negative voltage-current characteristics in the Josephson junction. It will be understood from this Figure that the superconducting critical current $I_t$ in the Josephson junction decreases in proportion as the injection current $I_j$ increases. This relation is shown particularly in FIG. 14(B). FIG. 14(B) also includes the characteristics of the negative injection current $I_j$ and it proves that there is sufficient current gain between the input and the output when the device of this invention is applied to the switching circuit of FIG. 6 or the amplifying circuit of FIG. 9.

As is evident from the description given above, the quasiparticle injection control type superconducting device of this invention comprises a Josephson junction element and a third electrode for the injection of quasiparticles attached either to the superconductors making up the Josephson junction element or the link part of the superconductors.

The embodiments of this invention described above have been directed to a superconducting device comprising a Josephson junction element and a third electrode for injection of quasiparticles attached to the element.

Figure 15A:
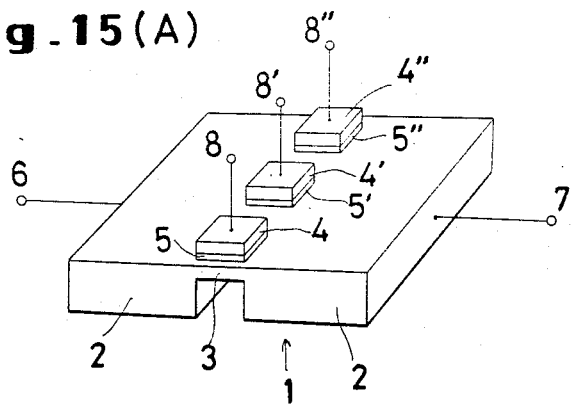
FIG. 15(A) is a perspective view illustrating the construction of a further embodiment of the device according to this invention.

Attachment of a plurality of third electrodes to the element makes the superconducting device more functional. One embodiment thereof is shown in FIG. 15(A). The superconducting device in this embodiment comprises a Josephson junction element 1 formed of a pair of superconductors 2 and a weak link part 3 given a layer thickness smaller than the thickness of the superconductors, three third electrodes 4, 4' and 4" for injection of quasiparticles disposed on the weak link part through the medium of insulating barriers 5, 5' and 5" and terminals 8, 8' and 8" connected respectively to the third electrodes. The device having the construction described above is much superior in function. When the device is applied to the switching circuit of FIG. 6, for example, the voltage-current characteristic in the Josephson junction can be controlled by applying voltage independently to the terminals 8, 8' and 8", therefore, the device can perform a logic AND-operation or a logic OR-operation. To be specific, when the Josephson junction element is used as a logic AND circuit, the element is caused to be in the voltage state by applying voltage to the three terminals 8, 8' and 8". And, when the element is used as a logic OR circuit, the element is caused to be in the voltage state by applying voltage to at least one of the terminals.

Figure 15B:
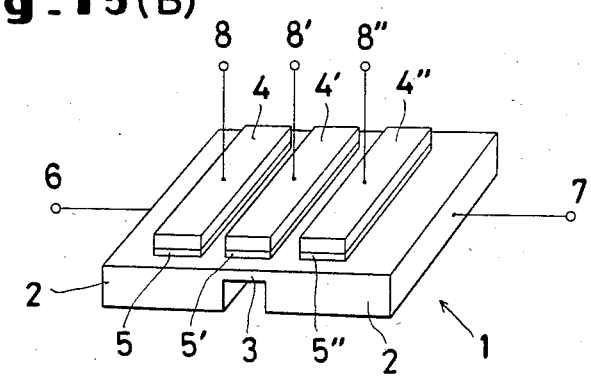
FIG. 15(B) is a perspective view illustrating the construction of a still further embodiment of the device according to this invention.

FIG. 15(B) illustrates another embodiment of the superconducting device of this invention, wherein three third electrodes 4, 4' and 4" for injection of quasiparticles are attached one each to the weak link part 3 and the pair of superconductors 2 through the medium of the insulating barriers 5, 5' and 5". The device in this embodiment brings about the same function as that of the device of FIG. 15(A).

The third electrodes for injection of quasiparticles used in the embodiments of FIGS. 15(A) and 15(B) are made of a normal metal, superconducting metal or semiconductor as in the preceding embodiments. The known Josephson junction elements 1 shown in FIGS. 3–5 may be used in the embodiments of FIGS. 15(A) and 15(B).

The characteristics of the device incorporating this third electrode are as enumerated below.

(1) In the conventional magnetic field control type Josephson junction element, the position of the control line relative to the junction greatly affects the characteristics and the size of the control line capable of effectively generating a magnetic field falls within a limited range, it is not always easy to construct an integrated circuit of highly reliable performance by using such elements. Since the device of this invention effects the control of the characteristics of the Josephson junction by enabling quasiparticles to be injected through a terminal joined directly to the Josephson element, the limit imposed on the size of the element is notably alleviated, the construction of an integrated circuit is made decisively easy, and the reliability of performance is improved.

(2) The sensitivity of operation particularly for the purpose of switching is greatly improved when the device is constructed so that quasiparticles are injected into the weak link part of the Josephson junction.

(3) The device of this invention is operable irrespectively of the polarity of the input electrode and, therefore, promises greater freedom of circuit design.

(4) Because the device is so constructed that the injection of quasiparticles is effected through the medium of an insulating barrier, the device permits easy control of its input impedance and adds to the freedom of circuit design.

As described above, the present invention provides a device so constructed that the current-voltage characteristic of the Josephson junction, the superconducting critical current, and the junction voltage can be controlled by the quasiparticles injected into the superconductors and/or the weak link part. Thus, in addition to the advantage of the conventional Josephson junction element that the operation proceeds at a superhigh speed with extremely small evolution of heat and excels in power-saving property, the device of this invention enjoys an advantage that it permits high-density integration. The device suits the manufacture of integrated devices for logical operations and contributes immensely to the growth of these integrated devices.

What is claimed is:

1. A quasiparticle injection control type superconducting device, comprising:
    a Josephson junction element formed of a weak link part, a first superconductor joined to one surface of said weak link part and a second superconductor joined to the other surface of said weak link part; and
    quasiparticle injecting means provided on at least a portion of said weak link part excluding the portions thereof having said first and second superconductors joined thereto for injecting quasiparticles directly into said weak link part;
    whereby injection of quasiparticles causes the current-voltage characteristics of said Josephson element to be controlled.

2. A quasiparticle injection control type superconducting device according to claim 1, further comprising another quasiparticle injecting means provided on said first superconductor.

3. A quasiparticle injection control type superconducting device according to claim 1, further comprising quasiparticle injecting means provided one each on said first and second superconductors.

4. A quasiparticle injection control type superconducting device according to claim 1, wherein said quasiparticle injecting means comprises an insulating barrier and an electrode coupled to said weak link part through said insulating barrier.

5. A quasiparticle injection control type superconducting device according to claim 2, wherein said another quasiparticle injecting means comprises an insulating barrier and an electrode coupled to said first superconductor through said insulating barrier.

6. A quasiparticle injection control type superconducting device according to claim 3, wherein each of said quasiparticle injecting means comprises an insulating barrier and an electrode coupled to the superconductor through said insulating barrier.

7. A quasiparticle injection control type superconducting device according to claim 4, wherein said electrode is made of a normal metal, superconducting metal or semiconductor.

8. A quasiparticle injection control type superconducting device according to claim 5, wherein said elecrode is made of a normal metal, superconducting metal or semiconductor.

9. A quasiparticle injection control type superconducting device according to claim 6, wherein said electrode is made of a normal metal, superconducting metal or semiconductor.

10. A quasiparticle injection control type superconducting device according to claim 1, wherein said quasiparticle injecting means is a semiconductor.

11. A quasiparticle injection control type superconducting device according to claim 2, wherein said another quasiparticle injecting means is a semiconductor.

12. A quasiparticle injecting control type superconducting device according to claim 3, wherein said quasiparticle means are semiconductors.

* * * * *